United States Patent [19]

Sherif et al.

[11] Patent Number: 4,764,357

[45] Date of Patent: Aug. 16, 1988

[54] PROCESS FOR PRODUCING FINELY DIVIDED POWDERY METAL OXIDE COMPOSITIONS

[75] Inventors: Fawzy G. Sherif, Stony Point; Francis A. Via, Yorktown Heights, both of N.Y.

[73] Assignee: Akzo America Inc., New York, N.Y.

[21] Appl. No.: 47,096

[22] Filed: May 8, 1987

Related U.S. Application Data

[63] Continuation-in-part of Ser. No. 23,581, Mar. 9, 1987, abandoned.

[51] Int. Cl.$^4$ .............................................. C01B 33/12
[52] U.S. Cl. .................................... 423/338; 423/593; 423/608; 423/622; 423/625; 501/1; 501/12; 501/94; 501/103; 501/134; 420/901
[58] Field of Search ...................... 501/1, 94, 103, 105, 501/152, 134, 135, 12; 423/338, 593, 608, 622, 625; 420/901; 252/521

[56] References Cited

U.S. PATENT DOCUMENTS

| | | | |
|---|---|---|---|
| 4,543,341 | 9/1985 | Barringer et al. | 501/1 |
| 4,598,107 | 7/1986 | Herron et al. | 523/351 |
| 4,642,207 | 2/1987 | Uda | 264/10 |
| 4,654,075 | 3/1987 | Cipollini | 75/0.5 A |
| 4,670,047 | 6/1987 | Kopatz et al. | 75/0.5 B |

OTHER PUBLICATIONS

Ashburn et al., "High-Pressure Study of New Y-Ba-Cu-O Superconducting Compound System", Physical Review Letters, vol. 58, No. 9, 3-2-87, pp. 911-912.

Orlando et al., "Upper Critical Fields of High-T$_c$ Superconducting Y$_{2-x}$Ba$_x$CuO$_{4-y}$", Physical Review Letters, vol. 35, No. 13, 5-1-87, pp. 7249-7251.

Chem. Abs., vol. 96, 106556h, "Modification of Porous Structure of Alumina".

E. M. Engler et al., "Superconductivity Above Liquid N$_2$ Temperature: Preparation and Properties of a Family of Perovskite-Based Superconductors", Journal of the American Chemical Society, vol. 109, No. 9, 4-29-87, pp. 2848-2849.

Barringer, Eric A., "Formation, Packing, and Sintering of Monodisperse TiO$_2$ Powders", Communications of the American Ceramic Society, Dec. 1982.

Wallace, S. et al., "The Processing and Characterization of DCCA Modified Gel-Derived Silica", Mat. Res. Soc. Symp. Proc., vol. 32, 1984, pp. 47-52 and 71-77.

Chem. Abs., vol. 105, 83955a, "Dielectric Ceramic Green Sheet".

Chem. Abs., vol. 98, 91919u, "Finely Powdered Alumina Oxide".

The Ceramist as Chemist, "Opportunities for New Materials", D. R. Uhlmann et al; Mat. Res. Soc. Symp. Proc., vol. 32, pp. 59-71.

Chemical and Engineering News, Apr. 13, 1987, pp. 4 and 5.

Primary Examiner—Patrick P. Garvin
Assistant Examiner—Paige C. Harvey
Attorney, Agent, or Firm—Richard P. Fennelly; Francis W. Young; Louis A. Morris

[57] ABSTRACT

A finely divided metal oxide powdery composition, preferably with a narrow particle size distribution, is produced from a particulate, sol-gel derived composition containing agglomerates by heating the particulate composition in the presence of an effective amount of a composition which decomposes upon heating and forms a gas to break at least a portion of the agglomerates so as to yield the desired finely divided ceramic particle composition. Examples of suitable gas-forming agents for use in the present invention include the ammonium salts or amides of organic and inorganic acids, volatile acids, and gases dissolved in a suitable solvent, such as water, alcohol or ammonia.

13 Claims, No Drawings

PROCESS FOR PRODUCING FINELY DIVIDED POWDERY METAL OXIDE COMPOSITIONS

This application is a continuation-in-part of U.S. Ser. No. 23,581, filed Mar. 9, 1987, now abandoned.

BACKGROUND OF THE PRESENT INVENTION

1. Field of the Present Invention

The present process is designed to yield a finely divided powdery composition by heating a particulate, sol-gel derived metal oxide composition containing one or more agents which generate gas upon heating to deagglomerate the particulate composition.

2. Description of the Prior Art

The formation of particulate, sol-gel derived metal oxide compositions containing small particles (e.g., of submicron size) having a tendency to generally agglomerate, particularly when isolated from solution, is well known. Such particulate compositions are formed by precipitation of the metal oxide or oxides by hydrolysis from liquid solutions so that a sol is first formed followed by collecting the precipitate which is then allowed to dry, as broadly indicated in U.S. Pat. No. 4,543,341 to E. A. Barringer et al. at Col. 1, line 64 to Col. 2, line 4. In such particulate compositions, the size of the primary particles is controlled by a number of factors relating to their method of synthesis, including, the rate of hydrolysis and rate of stirring, in the hydrated medium where the synthesis occurs. As mentioned in the Barringer et al. patent, the generally small particles formed by this type of method tend to agglomerate thereby causing problems in their later sintering to form sintered ceramic parts unless sintering additives are utilized.

Certain attempts have been made to avoid such agglomeration problems by controlling the preparative process in which the sol-gel derived metal oxides are formed.

For example, Barringer et al., in the aforesaid U.S. Pat. No. 4,543,341 and in Communications of the American Ceramic Society (December 1982), pages C-199-C-201, indicates that the stability against coagulation or agglomeration in aqueous dispersions of oxide powders requires a low electrolyte concentration and a solution pH that is several pH units above or below the isoelectric point of the oxide.

L. L. Hench and co-workers in Mat. Res. Soc. Symp. Proc., Vol. 32, pages 47-52 and 71-77, disclose the use of a drying control chemical additive, i.e. formamide, to prevent fracture upon drying of a sol-gel derived sodium oxide/silicon dioxide system. The drying control chemical additive was indicated as acting by reason of intramolecular bonding forces, i.e. due to hydrogen bond formation between the formamide amine groups and the hydroxide groups on the silica particle surfaces.

SUMMARY OF THE PRESENT INVENTION

The present invention differs from the previously mentioned work by Barringer et al., Hench et al., and many others since it is directed to the deagglomeration of the particulate metal oxide formed by hydrolysis of alkoxides or salt precursors. This process of controlled hydrolysis-condensation-precipitation is commonly referred to by persons in the art as "sol-gel synthesis", hence the terminology "sol-gel derived" is used herein. The formation of a gel may refer to an individual particle or collection of particles and not necessarily a physical gelation of the reaction mixture. If the hydrolysis reaction is conducted to obtain a gel, this can be used to obtain either powders or a monolith of glass. A good general introduction to this field of technology is provided by "The Ceramist As Chemist—Opportunities For New Materials", D. R. Uhlmann et al., Better Ceramics Through Chemistry, C. J. Brinker et al., ed., Mat. Res. Soc. Symp. Proc., Vol. 32, page 59 and following (1984).

The present invention, since it is not directed to control of the actual synthesis procedures for forming powders, allows one to use synthesis procedures which can utilize a relatively higher concentration of alkoxides or soluble salts, thereby giving faster production rates and yields even if agglomeration problems result since such problems can be overcome by use of the present technique. Overall, better economics are likely since the overall process would be less sensitive to process variables and better adapted to scale-up for commercial production.

The present invention relates to a novel approach to overcoming the problems associated with the agglomerative tendency of smaller particles in the particulate, sol-gel derived metal oxide compositions described before. It relies upon the use of a novel type of additive to reduce the degree of agglomeration in such systems apparently without any substantial change of the morphology of the individual particles that form such agglomerates.

The present invention is more particularly intended to find use in the preparation, for example, of advanced ceramic powders and other powdery materials with a small, single digit particle size (i.e., below about 10 microns), and, preferably, a narrow particle size distribution. As proposed by certain persons in the art, highly ordered green bodies formed by compacting these fine, powdery materials are desirable because such bodies can be sintered to form fine grained ceramics having high density characteristics.

The present invention relies upon the use of a micro-"explosive" chemical deagglomeration (MED) technique. This technique utilizes a gas-forming agent added to the particulate, sol-gel derived metal oxide composition which functions by decomposition and formation of gas to yield the desired finely divided powdery composition. The powdery metal oxide compositions that are produced by use of the present invention preferably have an average particle size of less than about 5 microns and also, preferably, have a uniform, narrow particle size distribution and have an improved non-agglomerative character while retaining the morphology of the present particulate composition (e.g., the present technique does not result in the production of a substantial quantity of fragmented particles as would be likely if standard milling procedures were used instead).

DETAILED DESCRIPTION OF THE PRESENT INVENTION

The present invention is broadly applicable to the MED treatment of particulate, sol-gel derived metal oxide compositions which are well known to persons of ordinary skill in the art. In practicing the present invention, it is desirable that the particulate composition be one which does not contain appreciable amounts of sintered particles. It has been found, for example, that the use of a sintered alumina composition with the type of gas-forming agents contemplated by the present process under similar conditions to those shown in the Examples does not yield the desired results because of the sintered nature of the material.

The present invention relies upon a MED technique which is defined as the addition of certain chemical additives which thermally decompose to form gaseous products which do not result in the deleterious depositing of impurities in the desired final product. The process of vaporization of these materials may also expand the internal pore structure of the agglomerated particulate, sol-gel derived metal oxide composition to which they are added leading to deagglomeration of at least a portion of the composition into smaller, preferably uniform particles.

The type of gas-forming agents that can be used in accordance with the present invention include ammonium salts and amides of organic and inorganic acids that decompose to form gaseous products. Examples of such products are ammonium nitrate, ammonium nitrite, ammonium hydroxide, ammonium carbonate, ammonium oxalate, ammonium formate, and urea. Others include ammonium acetate, ammonium carbamate, ammonium bicarbonate, ammonium iodate, ammonium hydrogen oxalate, and ammonium thiocarbamate.

Also included within the scope of the gas-forming agents which can be used herein are volatile acids such as oxalic acid, citric acid, benzoic acid, and carbonic acid.

Finally, gases that are dissolved in a suitable solvent, e.g., water, alcohol or ammonia, such as carbon dioxide, nitrous oxide, oxygen and ozone can also be used to generate gases during solvent removal, thereby inducing the desired degree of fracturing of the particles and non-agglomeration character of the desired structure.

In regard to the amounts which can be used, it is deemed that from about 1% to about 50% by weight of the gas-forming agents can be used in the particulate composition which is to be treated. Higher amounts can also be used, if desired.

The particulate, sol-gel derived metal oxide compositions which can be treated by the MED technique described herein include such ceramic metal oxides as alumina, baria, silica, zirconia, yttria, magnesia, titania, and mixtures thereof. The present technique is applicable for forming metal oxide compositions which have superconductive properties. Recently, much interest has centered on such kinds of materials. For example, Chemical and Engineering News, Apr. 13, 1987 contains a report on a multiphase yttrium-barium-copper oxide (identified as $YBa_2Cu_3O_7$) having superconductive properties. The replacement of yttrium in the above material with rare earth elements such as Nd, Sm, Eu, Gd, Dy, Ho, Yb, Lu, $Y_{0.5}$-$Sc_{0.5}$, $Y_{0.5}$-$La_{0.5}$, and $Y_{0.5}$-$Lu_{0.5}$, and the replacement of barium with Sr-Ca, Ba-Sr, or Ba-Ca also yields effective materials as reported in "Superconductivity Above Liquid Nitrogen Temperature: Preparation and Properties of a Family of Perovskite-Based Superconductors", by E. M. Engler et al., distributed at the American Chemical Society Meeting, April 1987, Denver, Colo.

The process of forming the particulate, sol-gel derived metal oxide composition, as indicated earlier, preferably comprises the formation of a suitably hydrated composition of the desired particles, preferably in an organic solvent such as a normal alcohol. The process is, preferably, easily practiced by simply allowing the hydrated particulate composition (i.e., the ceramic metal oxide composition), optionally in the alcohol, to form by controlled hydrolysis-condensation of a metal source to form a sol followed by precipitation, separation and drying. In accordance with the present invention, the resulting compositions, which contain agglomerated particles (about 1–100 microns in size), are admixed with the gas-forming agent or agents and allowed to come to a temperature which causes the gas-forming agent to decompose into its gaseous products or by-products, thereby insuring the desired particle size distribution for the final product.

The micro-explosive deagglomeration (MED) technique described herein is suitable for the obtaining of small median particle size, preferably mono-size powders. In this method, a particulate, sol-gel derived metal oxide composition (or powder) is treated with a gas-forming agent, either before or after precipitation. That gas-forming agent (e.g., a salt such as ammonium nitrite) can be dried onto the particulate composition. When the temperature exceeds the decomposition temperature of the gas-forming agent, the volatilization of gases therefrom breaks apart agglomerated particles contained in the particulate composition to which it has been applied. The composition contains less agglomerates than prior to the MED treatment. The particle size may vary from about under 0.1 to about 10 microns, more preferably from about 0.1 to about 2 microns. Most preferably, the size is from about 0.2 to about 1.0 micron.

The present invention is further illustrated by the Examples which follow.

EXAMPLE 1

A solution containing 42.9 cc of a zirconium n-butoxide.1-butanol $(Zr(O-nC_4H_9)_4 \cdot C_4H_9OH)$ composition dissolved in 500 cc of n-propanol was hydrolyzed by adding to it a solution of 7.2 cc of water in 500 cc of n-propanol. The mixture was stirred in a round bottom flask under a nitrogen atmosphere for 30 seconds. After standing for one minute the solution became cloudy and a white solid was formed throughout the liquid. The mixture was stored for 72 hours. The solid was then separated by centrifuging.

One half of the solid was dried in air overnight and then at 120° C. for one hour and was designated "Sample A". About 5.9 gm of a white powder was formed. It was crushed to break a few lumps and was then sieved through a 325 mesh screen.

The other half of the solid was mixed with 10 cc of ammoniacal ammonium nitrite solution, in accordance with the present invention, was dried in air overnight and then at 120° C. for one hour. About 6.2 gm of a white solid powder formed. The lumps were crushed and the solid was sieved through a 325 mesh screen and was designated "Sample B".

The results of a particle size distribution analysis obtained by using a Lazer Granulometer Silas 715 apparatus are given as follows:

| SAMPLE A (Interval) | | SAMPLE B (Interval) | |
| --- | --- | --- | --- |
| Microns | % | Microns | % |
| 1 | 12.1 | 1 | 22.0 |
| 1.5 | 14.1 | 1.5 | 14.5 |
| 2 | 2.9 | 2 | 26.4 |
| 3 | 22.2 | 3 | 29.8 |
| 4 | 0.0 | 4 | 0.0 |
| 6 | 0.4 | 6 | 3.9 |
| 8 | 0.0 | 8 | 0.0 |
| 12 | 2.7 | 12 | 0.9 |

-continued

| | | | |
|---|---|---|---|
| 16 | 0.0 | 16 | 0.0 |
| 24 | 8.4 | 24 | 2.3 |
| 32 | 0.0 | 32 | 0.0 |
| 48 | 11.8 | 48 | 0.0 |
| 64 | 0.0 | 64 | 0.1 |
| 96 | 0.0 | 96 | 0.1 |
| 128 | 18.9 | 128 | 0.0 |
| 192 | 6.5 | 192 | 0.0 |

| SAMPLE A (Cumulative, Less) | | SAMPLE B (Cumulative, Less) | |
|---|---|---|---|
| Microns | % | Microns | % |
| 1 | 12.1 | 1 | 22.0 |
| 1.5 | 26.2 | 1.5 | 36.5 |
| 2 | 29.1 | 2 | 62.9 |
| 3 | 51.3 | 3 | 92.7 |
| 4 | 51.3 | 4 | 92.7 |
| 6 | 51.7 | 6 | 96.6 |
| 8 | 51.7 | 8 | 96.6 |
| 12 | 54.4 | 12 | 97.5 |
| 16 | 54.4 | 16 | 97.5 |
| 24 | 62.8 | 24 | 99.8 |
| 32 | 62.8 | 32 | 99.8 |
| 48 | 74.6 | 48 | 99.8 |
| 64 | 74.6 | 64 | 99.9 |
| 96 | 74.6 | 96 | 100.0 |
| 128 | 93.5 | 128 | 100.0 |
| 192 | 100.0 | 192 | 100.0 |

Sample B shows a more uniform particle size distribution than Sample A with greater than 92% of particles less than 3 microns in size indicating lower agglomeration. The distribution of particle sizes for Sample A is distinctly broader with a significant proportion of particles less than 3 microns followed by another concentration of particles in the range of 10–100 microns. The latter distribution is probably formed from agglomerates of the primary particles.

EXAMPLE 2

Zirconium n-butoxide.1-butanol (Zr(O-nC$_4$H$_9$)$_4$.C$_4$H$_9$OH) complex (86 cc) was dissolved in 1000 cc of n-propanol and was stirred under nitrogen in a round bottom flask. A solution of 14.4 cc of deionized water in 1000 cc of n-propanol was then added rapidly to the zirconium butoxide solution. The mixture was stirred for 15 seconds. After another 15 seconds, the whole mixture became cloudy and, after one hour, a white colloidal precipitate was formed. After 24 hours standing, the white solid was separated by centrifuging and was washed two times with excess n-propanol. About 2.5 gm of the wet solid was left to dry in air, then dried in an oven at 85° C. for three hours. This sample was designated "Sample A".

Another 2.5 gm of wet solid was mixed with 1 cc of saturated ammonium carbonate solution and 49 cc of water, was dried in air, and then was dried at 85° C. for three hours. It was designated as "Sample B".

Both of the samples were gently crushed.

Samples A and B were analyzed for their particle size distribution. The results showed that Sample B contained more smaller particles than Sample A. For example, about 52%, by weight, of the particles in Sample B were less than 3 microns versus Sample A's having about 8%, by weight, of its particles less than 3 microns.

The results of the analyses were as follows:

| SAMPLE A | | SAMPLE B | |
|---|---|---|---|
| Diameter (Microns) | Cumulative, Less (%) | Diameter (Microns) | Cumulative, Less (%) |
| 1.0 | 4.0 | 1.0 | 18.2 |
| 1.5 | 5.3 | 1.5 | 30.0 |
| 2.0 | 6.5 | 2.0 | 36.3 |
| 3.0 | 7.9 | 3.0 | 51.7 |
| 4.0 | 8.2 | 4.0 | 51.7 |
| 6.0 | 9.7 | 6.0 | 52.5 |
| 8.0 | 10.5 | 8.0 | 52.5 |
| 12.0 | 13.7 | 12.0 | 56.0 |
| 16.0 | 16.0 | 16.0 | 56.0 |
| 24.0 | 23.2 | 24.0 | 62.0 |
| 32.0 | 27.0 | 32.0 | 62.0 |
| 48.0 | 41.5 | 48.0 | 76.3 |
| 64.0 | 44.8 | 64.0 | 76.3 |
| 96.0 | 59.1 | 96.0 | 100.0 |
| 128.0 | 89.7 | 128.0 | 100.0 |
| 192.0 | 100.0 | 192.0 | 100.0 |

The foregoing Examples should not be construed in a limiting sense since they are only deemed to be illustrative of certain preferred embodiments of the present invention. The scope of protection that is sought is set forth in the claims which follow.

We claim:

1. A process for producing a finely divided powdery metal oxide composition which comprises heating a particulate, sol-gel derived metal oxide composition, which contains agglomerates, and to which has been added an effective amount of a composition which decomposes at the temperature to which the metal oxide composition is heated to form a gas to break at least a portion of said agglomerates and to thereby yield said finely divided powdery composition.

2. A process as claimed in claim 1 wherein the composition which decomposes and forms a gas is an ammonium salt of an acid.

3. A process as claimed in claim 1 wherein the composition which decomposes and forms a gas is an amide.

4. A process as claimed in claim 1 wherein the composition which decomposes and forms a gas is a gas dissolved in a solvent.

5. A process as claimed in claim 1 wherein the composition which decomposes and forms a gas is a volatile acid.

6. A process as claimed in claim 1 wherein the composition which decomposes and forms a gas is ammonium carbonate.

7. A process as claimed in claim 1 wherein the composition which decomposes and forms a gas is ammonium nitrite.

8. A process as claimed in claim 1 wherein the average particle size of the powdery composition is less than about 5 microns.

9. A process as claimed in claim 1 wherein the particulate composition is prepared from alkoxides or soluble salts of the elements of zirconium, titanium, magnesium, yttrium, boron, tin, silicon and aluminum.

10. A process as claimed in claim 1 wherein the particulate composition comprises zirconia.

11. A process as claimed in claim 1 wherein the particulate composition comprises alumina.

12. A process as claimed in claim 1 wherein the particulate composition comprises silica.

13. A process as claimed in claim 1 wherein the metal oxide composition has superconductive properties.

* * * * *